US012596475B2

(12) United States Patent
Snyder et al.

(10) Patent No.: US 12,596,475 B2
(45) Date of Patent: Apr. 7, 2026

(54) COMPRESSION AND DECOMPRESSION OF MULTI-DIMENSIONAL DATA

(71) Applicant: Microsoft Technology Licensing, LLC, Redmond, WA (US)

(72) Inventors: John Michael Snyder, Redmond, WA (US); Nikunj Raghuvanshi, Redmond, WA (US); Michael G. Chemistruck, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 922 days.

(21) Appl. No.: 17/736,583

(22) Filed: May 4, 2022

(65) Prior Publication Data

US 2023/0280902 A1     Sep. 7, 2023

Related U.S. Application Data

(60) Provisional application No. 63/316,135, filed on Mar. 3, 2022.

(51) Int. Cl.
| | |
|---|---|
| *G06F 3/06* | (2006.01) |
| *G06F 7/02* | (2006.01) |
| *H03M 7/30* | (2006.01) |

(52) U.S. Cl.
CPC .............. *G06F 3/0608* (2013.01); *G06F 7/02* (2013.01); *H03M 7/30* (2013.01); *H03M 7/3084* (2013.01)

(58) Field of Classification Search
CPC .... H03M 7/30; H03M 7/3057; H03M 7/3084; H03M 7/3086; H03M 7/3088; H03M 7/3095; G06F 3/0608–0613; G06F 7/02; G06F 7/026; G06F 7/485; H04N 19/11; H04N 19/13; H04N 19/129
See application file for complete search history.

(56) References Cited

U.S. PATENT DOCUMENTS

| | | | |
|---|---|---|---|
| 2006/0106870 A1 | 5/2006 | Franaszek et al. | |
| 2011/0142137 A1* | 6/2011 | Leigh | H04N 19/63 |
| | | | 375/240.18 |
| 2017/0315778 A1* | 11/2017 | Sano | H03M 7/28 |

FOREIGN PATENT DOCUMENTS

| | | |
|---|---|---|
| WO | 2018094141 A1 | 5/2018 |

OTHER PUBLICATIONS

"Sentinel Value", Retrieved From: https://en.wikipedia.org/w/index. php?1%20itle=Sentinel%20value&oldid=999648096, Jan. 11, 2021, 3 Pages.

(Continued)

*Primary Examiner* — Emily E Larocque
(74) *Attorney, Agent, or Firm* — Rainier Patents, P.S.

(57) ABSTRACT

This document relates to the compressing and/or decompressing of spatial data. A block of spatial data can be compressed by iteratively performing compression iterations on portions of the block and splitting the portions into further portions until compression is completed. The compressed data can include first encoded values indicating whether matches were obtained for comparisons to test values during the compression iterations. The compressed data can also include second encoded values reflecting results of one or more modifications performed on the test values during the compression iterations.

20 Claims, 10 Drawing Sheets

(56)          References Cited

OTHER PUBLICATIONS

"International Search Report and Written Opinion Issued in PCT Application No. PCT/US23/012061", Mailed Date: May 11, 2023, 12 Pages.
"Discrete cosine transform", Retrieved From: https://en.wikipedia.org/wiki/Discrete_cosine_transform, Feb. 13, 2022, 15 Pages.
"Floating Point Compression: Lossless and Lossy Solutions", Retrieved From: https://computing.llnl.gov/projects/floating-point-compression, Retrieved on: Feb. 21, 2022, 1 Page.
"Hilbert curve", Retrieved From: https://en.wikipedia.org/wiki/Hilbert_curve, Sep. 10, 2021, 6 Pages.
"Octree", Retrieved From: https://en.wikipedia.org/wiki/Octree, Dec. 22, 2021, 5 Pages.
"Oculus From Meta", Retrieved From: https://about.facebook.com/technologies/oculus/, Retrieved on: Feb. 22, 2022, 5 Pages.
"Ones' complement", Retrieved From: https://en.wikipedia.org/wiki/Ones%27_complement, Feb. 1, 2022, 4 Pages.
"Project Triton", Retrieved From: https://www.microsoft.com/en-us/research/project/project-triton/, Retrieved on: Feb. 21, 2022, 5 Pages.
"Run-length encoding", Retrieved From: https://en.wikipedia.org/wiki/Run-length_encoding, Jan. 6, 2022, 3 Pages.
"The world's most open and advanced real-time 3D creation tool", Retrieved From: https://www.unrealengine.com/en-US/, Retrieved on: Feb. 21, 2022, 9 Pages.
"What is Project Acoustics?", Retrieved From: https://docs.microsoft.com/en-us/gaming/acoustics/what-is-acoustics, Apr. 26, 2021, 6 Pages.
"Zlib: A Massively Spiffy Yet Delicately Unobtrusive Compression Library", Retrieved From: https://zlib.net/, Aug. 26, 2021, 5 Pages.
"Zfp: Compressed Floating-Point and Integer Arrays", Retrieved from: https://web.archive.org/web/20210712133941/https://computing.llnl.gov/projects/zfp, Jul. 20, 2021, 2 Pages.

* cited by examiner

202

204

208

MNJI EABF GCDH LKOP

HILBERT TRAVERSAL
ARRANGEMENT 210

ABCD EFGH IJKL MNOP

CONVENTIONAL MEMORY
ARRANGEMENT 206

HILBERT TRAVERSAL
ARRANGEMENT 406

0000 0000 0000 1111

CONVENTIONAL MEMORY
ARRANGEMENT 404

0000 0000 0011 0011

MNJI EABF GCDH &&&&

HILBERT TRAVERSAL
ARRANGEMENT 606

ABCD EFGH IJ&& MN&&

CONVENTIONAL MEMORY
ARRANGEMENT 604

METHOD
700

702 — OBTAIN BLOCK OF SPATIAL DATA

704 — PERFORM FIRST COMPARISONS

706 — PERFORM MODIFICATIONS ON FIRST TEST VALUES

708 — PERFORM SECOND COMPARISONS

710 — SPLIT PORTIONS

712 — OUTPUT COMPRESSED DATA

METHOD
800

FIG. 9

COMPRESSION AND DECOMPRESSION OF MULTI-DIMENSIONAL DATA

BACKGROUND

Spatial data, such as two- or three-dimensional bitfields, integers, or floating-point values, can be compressed using various techniques. However, spatial data often exhibits spatial coherence, e.g., nearby locations in space tend to have similar values. Conventional compression algorithms may not leverage spatial coherence effectively when compressing spatial data, as discussed more below.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The description generally relates to techniques for compression and/or decompression of data. One example includes a system having a hardware processing unit and a computer-readable storage medium storing computer-readable instructions. When executed by the hardware processing unit, the computer-readable instructions can cause the system to obtain a block of spatial data having input values arranged in two or more dimensions. The computer-readable instructions can also cause the system to perform one or more compression iterations. The one or more compression iterations can include performing first comparisons of portions of the block of spatial data to one or more first test values. The one or more compression iterations can also include performing one or more modifications on the one or more first test values to obtain one or more second test values when the first comparisons do not result in a match of the portions of the block to the one or more first test values. The one or more compression iterations can also include performing second comparisons of the portions of the block of data to the one or more second test values. The one or more compression iterations can also include splitting the portions into further portions and performing another compression iteration on the further portions when the second comparisons do not result in a match of the portions of the block to the one or more second test values. The computer-readable instructions can also cause the system to output compressed data including first encoded values indicating whether matches were obtained for the first comparisons or the second comparisons for particular portions of the block of data and second encoded values reflecting results of the one or more modifications.

Another example includes a method or technique that can be performed on a computing device. The method or technique can include retrieving a compressed representation of a block of data including first encoded values indicating whether portions of the block match test values and second encoded values reflecting results of one or more modifications performed on the test values. The method or technique can also include recovering a decompressed version of the block by selectively manipulating one or more variables of the decompressed version according to the first encoded values and the second encoded values.

Another example includes a computer-readable storage medium storing instructions which, when executed by a processor, cause the processor to perform acts. The acts can include retrieving a compressed representation of a block of data including first encoded values indicating whether portions of the block match test values and second encoded values reflecting results of one or more modifications performed on the test values. The acts can also include recovering a decompressed version of the block by selectively manipulating one or more variables of the decompressed version according to the first encoded values and the second encoded values. The acts can also include controlling an output device according to the decompressed version of the block.

BRIEF DESCRIPTION OF THE DRAWINGS

The Detailed Description is described with reference to the accompanying figures. In the figures, the left-most digit(s) of a reference number identifies the figure in which the reference number first appears. The use of similar reference numbers in different instances in the description and the figures may indicate similar or identical items.

FIG. 9 illustrates an example system, consistent with some implementations of the present concepts.

DETAILED DESCRIPTION

Overview

Run-length encoding is a lossless compression technique that can represent spatial data, such as an image bitmap, as a sequence of "runs" or sequences of repeated values. When the data includes long sequences of repeated values, run-length encoding can result in very effective compression. For instance, if an image is scanned sequentially from left-to-right and there are long sequences of identical pixel values along the scanning pattern, run-length encoding will compress the image very effectively.

However, in some cases, spatial data may have spatial coherence that does not follow traditional scanning patterns.

Thus, when represented in memory, spatial data with relatively strong spatial coherence may not compress effectively using traditional algorithms, partly because the data items are arranged in memory differently than they are in space.

The disclosed implementations provide compression techniques that leverage spatial coherence by arranging spatial data in memory so that values close to one another in space tend to be close to one another in memory. After being arranged in memory, the spatial data can be iteratively split into halves and encoded. Because of the properties of the algorithm used to arrange the data in memory, each split results in two halves where values close to one another in space remain near one another in memory. By encoding the spatial data in this manner, spatial coherence can be exploited for effective compression even in scenarios that might not compress effectively if the data were compressed using conventional techniques.

Example Encoding and Decoding

Figure 1:
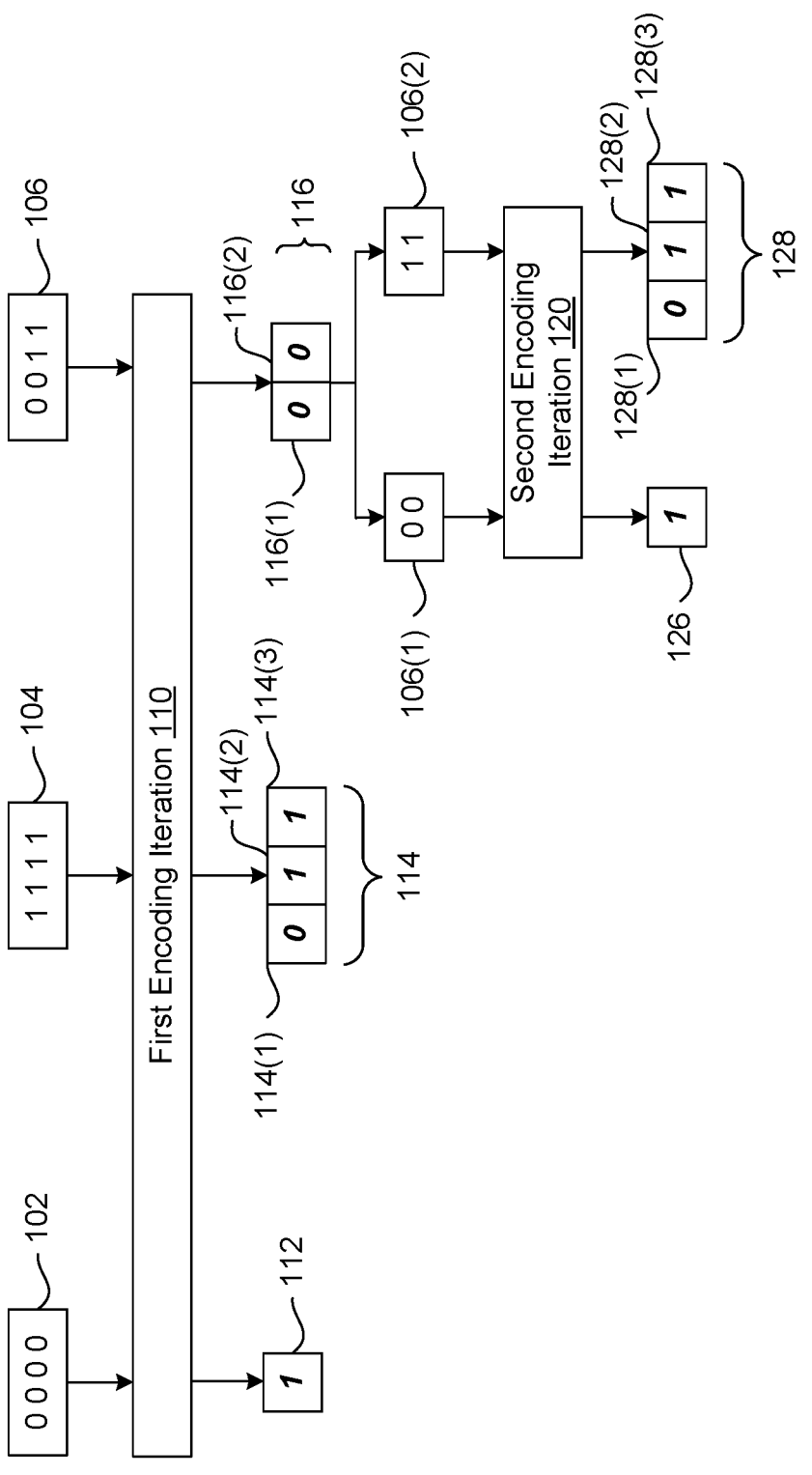
FIG. 1 illustrates an example of multiple encoding iterations that can be performed on binary data, consistent with some implementations of the present concepts.

FIG. 1 illustrates example encoding concepts that can be employed to compress blocks of data. A first input block 102, a second input block 104, and a third input block 106 can be encoded as described below. Here, each input block is a bit string of binary values—[0000], [1111], and [0011], respectively. For readability, FIG. 1 adopts the convention that input blocks are shown in standard font and encoded values are shown in bold italicized font.

First Encoding Iteration. A first encoding iteration 110 can be performed on the input blocks, as described below. The first encoding iteration can start with an initial bit string of first test values, e.g., [0000] and proceed as follows.

With respect to first input block 102, the first encoding iteration 110 can perform a first comparison of values of the input block [0000] to the first test values [0000]. In response to determining that the values of the input block match the first test values, the first encoding iteration 110 can write an encoded output 112 to memory or storage, where the encoded output 112 is an encoded representation of first input block 102. Here, the encoded output is a single test result bit with a value of [1], indicating that the first test values matched the first input block 102. Thus, the full encoding of first input block 102 is a single test result bit with a value of [1].

With respect to second input block 104, the first encoding iteration 110 can perform a first comparison of the values [1111] of the input block to the first test values [0000]. In response to determining that the second input block does not match the first test values, the first encoding iteration 110 can perform a modification operation on the first test values to obtain second test values. Here, the modification operation involves flipping all bits of the first test values, resulting in second test values of [1111]. The first encoding iteration can then determine whether the modification improves the match of the second test values to the input block (e.g., the second test values have more bits in common with the input block than the first test values). Here, first encoding iteration can determine that the second test values [1111] completely match the second input block 104. The first encoding iteration can write an encoded output 114 to memory or storage, where the encoded output 114 is an encoded representation of second input block 104.

Here, the first bit 114(1) of encoded output 114 is a test result bit with a value of 0, indicating that the first comparison of the first test values of [0000] did not match the input block values of [1111]. The second bit 114(2) of encoded output 114 is an improved bit with a value of [1], indicating that the modification of the first test values [0000] to the second test values [1111] resulted in a closer match between the second test values and the input block. In other words, the second test values are relatively more similar (e.g., as determined by Hamming distance) to the input block than the first test values. The third bit 114(3) of encoded output 114 is another test result bit with a value of [1] indicating that the encoding is complete, because a complete match of the modified test values [1111] was obtained to the values [1111] of the second input block 104 when the second comparison was performed. Thus, the full encoding of second input block 104 is [011].

With respect to third input block 106, the first encoding iteration 110 can perform similar operations as described above. A first comparison of the values [0011] of the input block to the first test values [0000] is performed. In response to determining that the values of the input block do not match the first test values, the first encoding iteration 110 can perform a modification operation on the first test values to obtain second test values. Again, the modification operation involves flipping all bits of the first test values, resulting in second test values of [1111]. The first encoding iteration can then determine that the modification of the first test values did not improve the match, e.g., the first test values of [0000] have the same Hamming distance (2) from the values [0011] of the input block as the second test values of [1111].

The first encoding iteration can write a partial encoded output 116 to memory or storage. The partial encoded output 116 includes a test result bit 116(1) with a value of [0], indicating that the first comparison of the first test result values of [0000] did not match the values [0011] of the third input block 106. The partial encoded output also includes an improved bit 116(2) with a value of [0], indicating that the modification of the first test values to the second test values of [1111] did not result in an improved match of the test values to the input block. Since the first encoding iteration did not obtain a complete match to the third input block 106, a second encoding iteration 120 is performed, as discussed more below.

Second Encoding Iteration. Prior to the second encoding iteration 120, third input block 106 can be split into portions (e.g., two halves) and the second encoding iteration can be performed on each portion. First portion 106(1) of the input block has values [00], and second portion 106(2) has of the input block has values [11]. The one or more first test values for the second iteration are obtained by splitting the initial test values into two halves, each with values of [00].

When performing the first comparison, the second encoding iteration 120 immediately obtains a match of the first test values [00] to the values [00] of the first portion 106(1), and a single test result bit 126(1) can be written as output with a value of [1], indicating that the first portion [00] matches the test values [00].

For the second portion 106(2) of the input block, the first test values of [00] do not initially match the second portion [11] when the first comparison is performed. Thus, a test result bit 128(1) is written with a value of [0]. The modification to the test values results in second test values of [11], which improves the match to the second portion [11] when the second comparison is performed. Thus, an improved bit 128(2) is written to the output with a value of [1]. Since the second test result values of [11] match the values [11] of the second portion 106(2) of the input block, a test result bit 128(3) is written to output with a value of [1].

Thus, the full encoding of third input block 106 is [001011], obtained by concatenating the output of the first encoding iteration 110 ([00]), with the output of the second encoding iteration 120 on the first portion ([1]) and the output of the second encoding iteration on the second portion ([011]). The first bit [0] of the full encoding [001011] is a test result bit 116(1) indicating that the first encoding iteration did not obtain a match to the first test values for the entirety of third input block 106. The second bit [0] of the full encoding [001011] is an improved bit 116(2) indicating that the modification of the first test values did not improve the match to the input block.

The third bit [1] of the full encoding [001011] is a test result bit 126 indicating that the second encoding iteration obtained a match to the first test values for the first half of third input block 106. The fourth bit [0] of the full encoding [001011] is test result bit 128(1) indicating that the second encoding iteration did not obtain a match to the first test values for the second half of third input block 106. The fifth bit [1] of the full encoding [001011] is an improved bit 128(2) indicating that the second encoding iteration determined that the modification to the first test values improved the match to the values of the second half of third input block 106. The sixth bit [1] of the full encoding [001011] is a test result bit 128(3) indicating that the second encoding iteration determined that the second comparison resulted in a complete match of the second portion to the second test values.

Decoding Examples. Decoding of the encoded blocks can generally proceed by performing operations indicated by the encodings on variables. When decoding is complete, the variables will match values of the input block with certain exceptions outlined in more detail below.

Consider first the encoded output 112 of first input block, which is a single test result bit with a value of [1]. Decoding can start with an array of variables populated with zeros, i.e., [0000]. Decoding can read the test result bit, determine that decoding is complete for the entire data item, and use unmodified array [0000] as the final decompressed block, which matches the values of first input block 102.

Next, consider encoded output 114, which is three bits [011] representing an encoding of the second input block 104. Decoding can start with an array of variables populated with values [0000]. Decoding can read the first test result bit 114(1), which has a value of [0]. Since this test result bit indicates no match is obtained, decoding can proceed to read the next bit, an improved bit 114(2) with a value of [1]. Accordingly, decoding can perform a modification to the variables in the array by flipping each of the bits, resulting [1111]. Next, decoding can read the next bit, a test result bit 114(3) with a value of 1. This indicates decoding is complete, so the modified array of values [1111] is used as the final decompressed block, which matches the values of second input block 104.

Consider next the encoded output of third input block 106, or [001011]. Decoding can start with an array of variables populated with values [0000]. Next, decoding can read the first bit of the encoded output, a test result bit 116(1) with a value of [0]. Since the test result bit indicates no match is obtained, decoding can proceed to read the next bit, an improved bit 116(2) with a value of [0]. Accordingly, decoding does not modify the variables of the array. Since decoding is not finished, decoding can perform a split of the variable array into two portions, resulting in a first portion [00] and a second portion [00]. Decoding can read the next bit, a test result bit 126 with a value of [1], indicating that the first portion [00] is decoded. The next bit is a test result bit 128(1) with a value of [0], indicating that the second portion [00] is not completely decoded. Next, decoding can read the improved bit 128(2), which has a value of [1] indicating that modification improves the match. Accordingly, decoding can flip the bits of the second portion of the variable array to obtain [11]. Next, decoding can read the test result bit 128(3) with a value of [1], indicating that the second portion is decoded. Thus, third input block 106 is fully decoded as the first portion [00] of the variable array concatenated with the modified second portion of the variable array [11], for a final decoded value of [0011] which matches the values of third input block 106.

Example Traversals

The encoding scheme described above can be employed to encode data stored in memory according to any arrangement. In the example above, data was stored in one-dimensional blocks, e.g., four consecutive bits. The disclosed implementations can also be employed to encode data stored in multi-dimensional representations, as described below.

Figure 2:
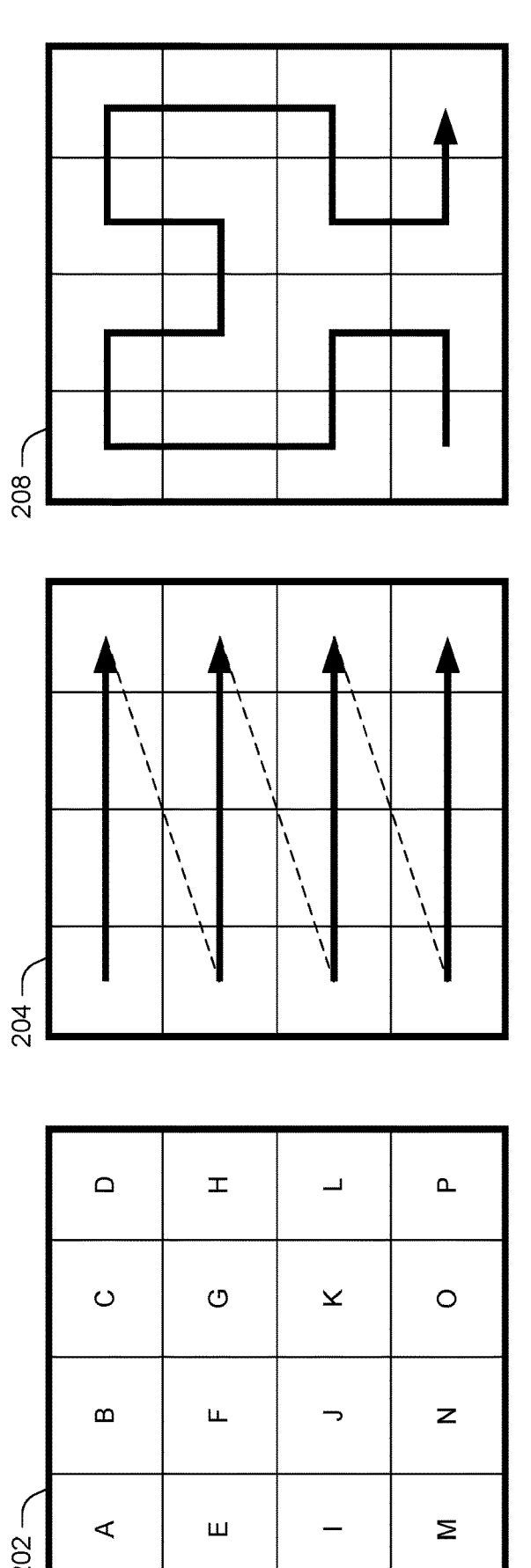
FIG. 2 illustrates examples of patterns for scanning spatial data and arranging the spatial data in memory for encoding, consistent with some implementations of the present concepts.
Figure 2:
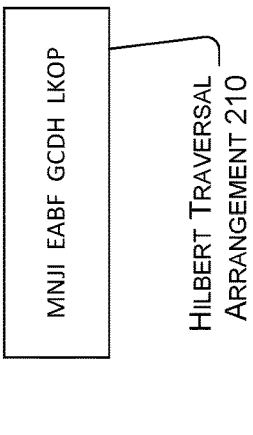
Figure 2:
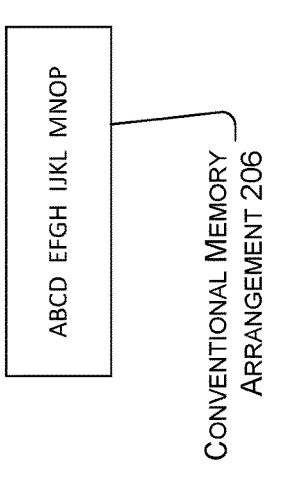

For instance, referring to FIG. 2, alphabetical values (e.g., characters) are stored in a block of data 202. One way to serialize block of data 202 is by horizontally scanning from left to right and returning to the left and dropping down one line after horizontal scan, as conveyed by scanning pattern 204. For instance, first the values [ABCD] can be scanned, then the next line [EFGH] can be scanned, then the next line [IJKL] can be scanned, then the next line [MNOP] can be scanned. The resulting serialization is shown in FIG. 2 as conventional memory arrangement 206. The block of data can then be encoded by inputting the conventional memory arrangement [ABCD EFGH IJKL MNOP] for encoding as described elsewhere herein.

In some implementations, however, a space-filing curve is used to arrange data in memory as an alternative to a conventional memory arrangement. For instance, scanning pattern 208 uses a space-filling curve (e.g., a Hilbert traversal) to scan the block of data 202 into memory. The resulting serialization is shown in FIG. 2 as a Hilbert traversal arrangement 210. Here, the input values are arranged by following the Hilbert curve starting from the bottom left and ending at the bottom right as follows: [MNJI EABF GCDH LKOP].

Generally speaking, arranging spatial data in memory according to a space-filling curve tends to preserve locality. The traversal proceeds such that the next-visited value in the block of data is physically adjacent to the previously-visited value. For reasons described more below, this can result in more effective compression of data that exhibits spatial locality.

Spatial Encoding Examples

Figure 3:
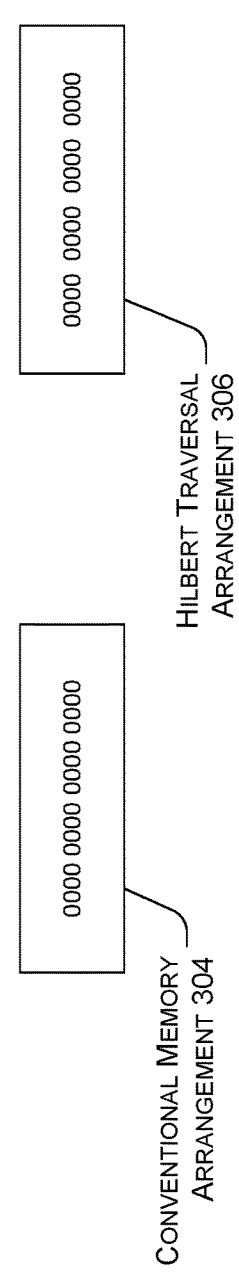
FIG. 3 illustrates a first example of compressing binary data arranged in memory according to different scanning patterns, consistent with some implementations of the present concepts.

FIG. 3 illustrates an example of arranging a block of data 302 using a conventional memory arrangement 304 and a Hilbert traversal arrangement 306. Here, a trivial example is provided where the block of data contains all 0's, and thus the arrangements in memory are identical. Given an initial first test value of [0000 0000 0000 0000], either arrangement can be represented as a single test result bit of 1.

Figure 4:
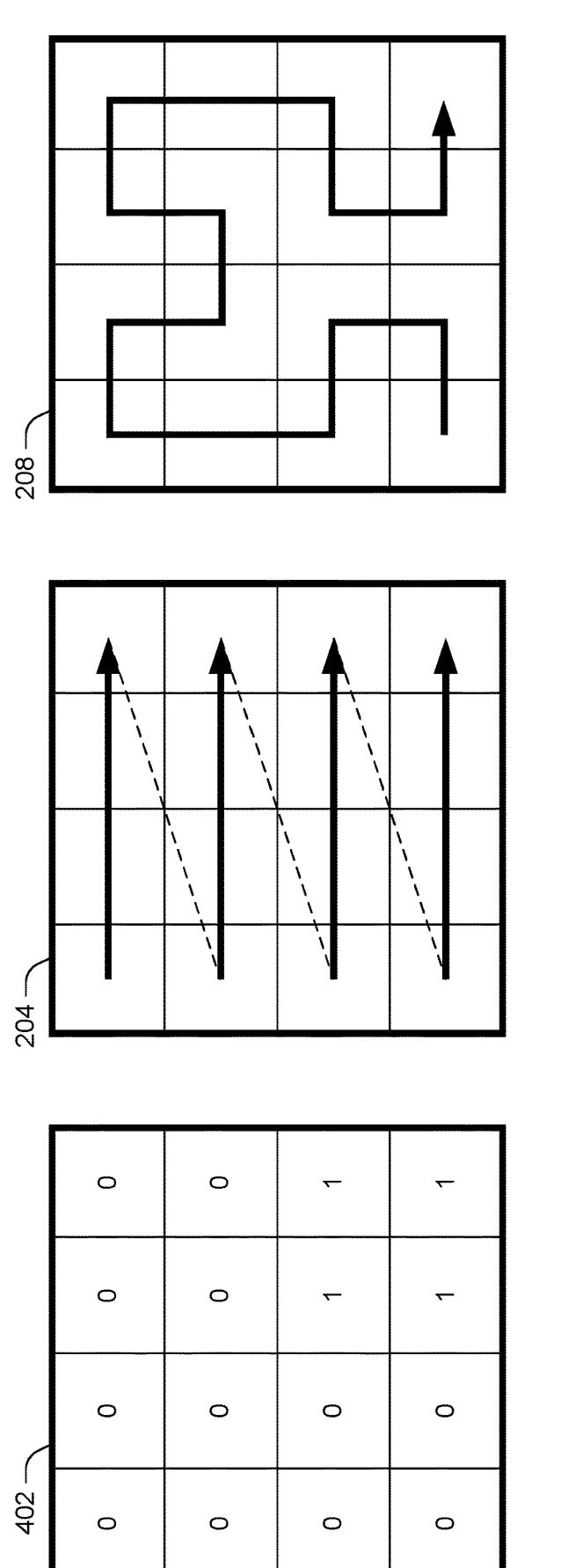
FIG. 4 illustrates a second example of compressing binary data arranged in memory according to different scanning patterns, consistent with some implementations of the present concepts.
Figure 4:
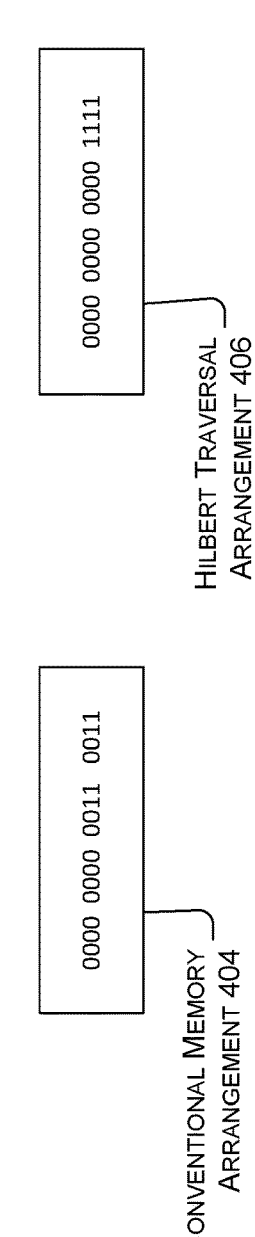

FIG. 4 illustrates an example of arranging a block of data 402 using a conventional memory arrangement 404 and a Hilbert traversal arrangement 406. Recall from above that more encoding iterations generally result in larger encoded representations. In other words, the fewer splits that are performed to encode a given block of data, the fewer bits are employed to represent that block when encoding is complete.

Here, the leftmost 8 bits of both the conventional memory arrangement 404 and the Hilbert traversal arrangement 406 are the same [0000 0000]. After an initial split, these can be represented as a single positive test result bit. However, note that the rightmost 8 bits of the memory arrangements are different, where the conventional memory arrangement 404 distributes 0's and 1's [0011 0011] in separate four-bit portions, whereas the Hilbert traversal arrangement 406 groups the 0's and 1's together as [0000 1111].

Figure 5:
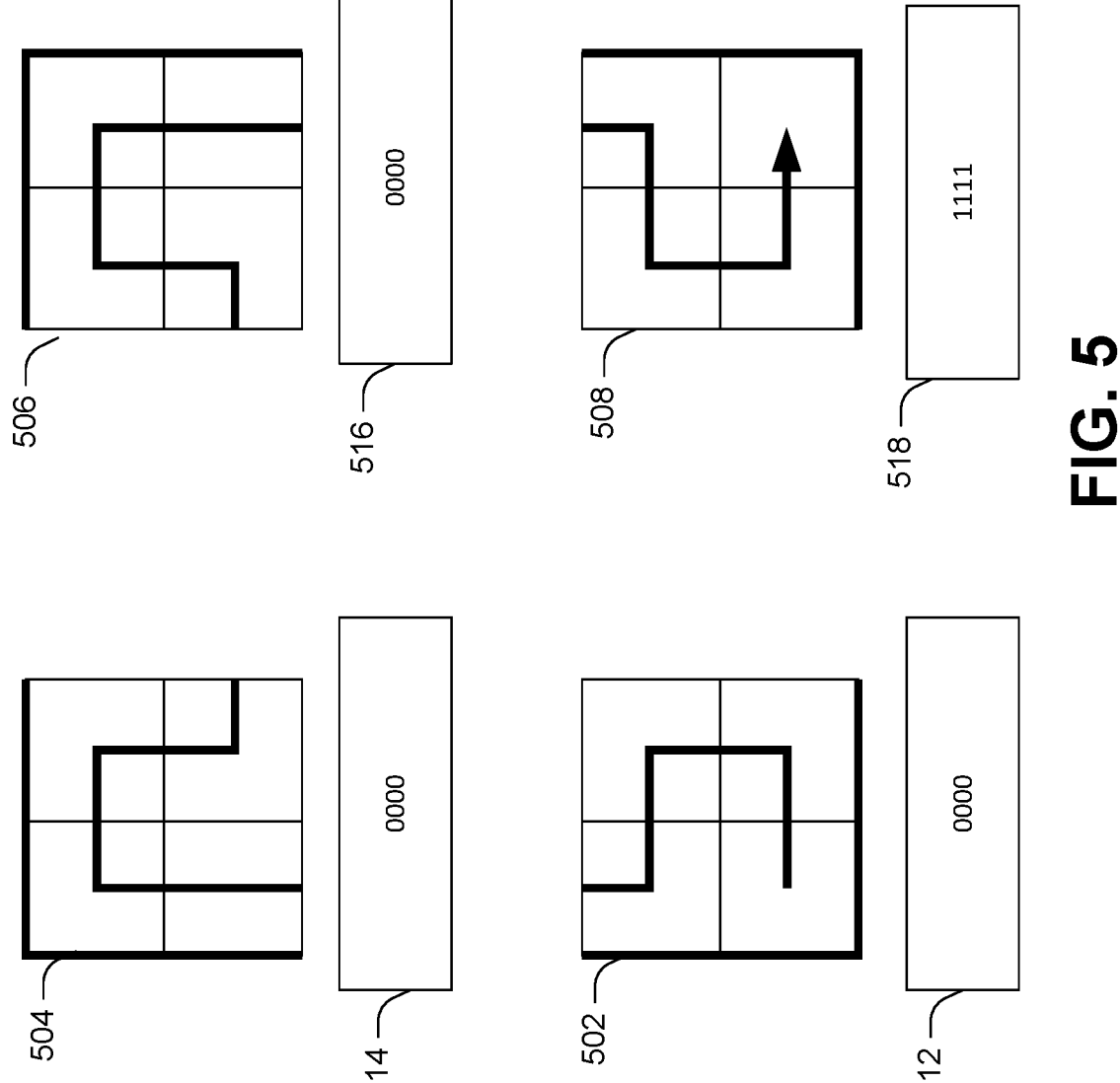
FIG. 5 illustrates spatial coherence of binary data within portions of a particular scanning pattern, consistent with some implementations of the present concepts.

FIG. 5 shows the Hilbert curve broken out into separate quadrants 502, 504, 506, and 508. Each corresponding quadrant has a respective bit string, e.g., quadrant 502 corresponds to bit string 512, quadrant 504 corresponds to bit string 514, quadrant 506 corresponds to bit string 516, and quadrant 508 corresponds to bit string 518. Hilbert traversal arrangement 406, in FIG. 4, includes bits arranged as quadrant 502 [0000], quadrant 504 [0000], quadrant 506 [0000], and quadrant 508 [1111].

Recall from FIG. 1 above that bit strings [0000] and [1111] can be encoded in a single encoding iteration. Thus, all four quadrants of the Hilbert traversal arrangement 406 can be encoded fully in a single encoding iteration. In contrast, encoding the same block of data 402 using the conventional memory arrangement 404 results in an additional encoding iteration for the third and fourth four-bit portions [0011] and [0011]. As a consequence, the Hilbert traversal arrangement can be used to compress the block of data more effectively than the conventional memory arrangement.

FIGS. 4 and 5 collectively illustrate how the use of a space-filling curve such as a Hilbert traversal can result in a correspondingly more compact (e.g., fewer bits) encoded representation of the block of spatial data than a conventional memory arrangement. Note that the 0's and 1's in block of data 402 tend to be located together in space, e.g., each quadrant shown in FIG. 5 has all the same values. When mapped to memory in the Hilbert traversal arrangement 406, the spatial coherence is preserved in memory, allowing like values to be encoded together. In contrast, the conventional memory arrangement 404 has values adjacent to one another in memory that are not adjacent to one another in space, resulting in an additional encoding iteration and a correspondingly larger encoded representation.

Example Sentinel Values

In some applications, there are locations in spatial data that do not need to be correctly encoded. For instance, consider sound parameter fields that convey how sound is perceived at different locations in a virtual space. The virtual space can have locations where users do not travel, e.g., walls or other off-limits areas. The disclosed implementations can employ sentinel values in blocks of data that indicate that these values can be effectively ignored during compression.

Figure 6A:
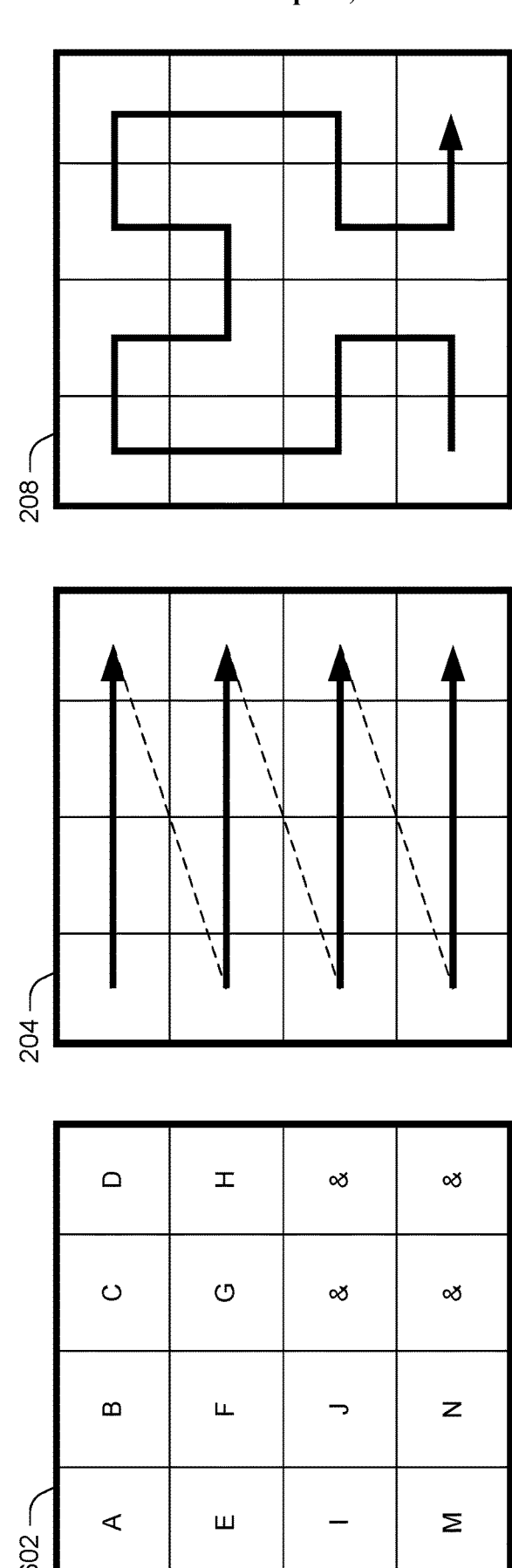
FIG. 6A illustrates the use of sentinel values that can be used for encoding purposes, consistent with some implementations of the present concepts.
Figure 6A:
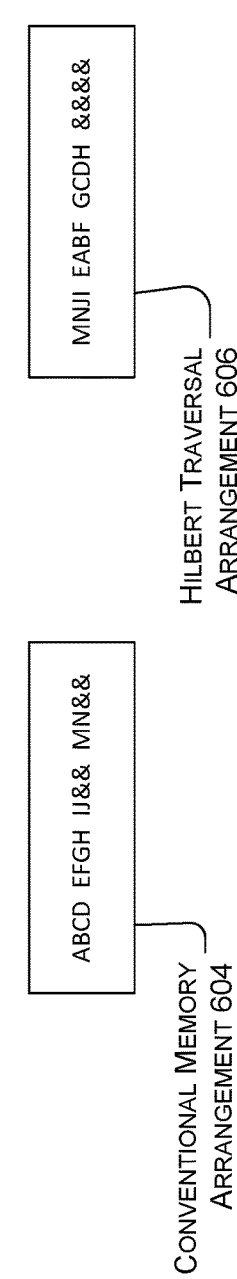

FIG. 6A illustrates a block of input data 602 with alphabetic data and sentinel values represented as ampersands [&]. When serialized according to scanning pattern 204, the resulting serialization is [ABCD EFGH IJ&& MN&&], as shown by conventional memory arrangement 604. When serialized according to scanning pattern 208, the resulting serialization is [MNJI EABF GCDH &&&&], as shown by Hilbert traversal arrangement 606.

Continuing with the concepts introduced previously, recall that each encoding iteration operates on a portion (e.g., half) of the previous input data. When encoding the conventional memory arrangement 604, the encoder will eventually arrive at the subsequence [&&] and recognize that the entire subsequence can be ignored. When encoding the Hilbert traversal arrangement 606, the encoder will arrive at the subsequence [&&&&] and recognize that the entire subsequence can be ignored. Since the encoder needs to perform fewer splits to reach the subsequence [&&&&] than to reach the subsequence [&&], the encoder can output a more compact representation of the block when using the Hilbert traversal than when using a conventional memory arrangement.

In the previous example, sentinel values were included in every location in a portion of a block being encoded, i.e., [&&&&]. However, sentinel values can also allow for more compact encodings even if other non-sentinel values are also present in the portion being encoded. For instance, consider a scenario where the portion being encoded is [A&&&]. If the first test values are [AAAA], this can be encoded as a single test result bit with a value of 1 by ignoring errors in the last three locations of the first test values, since these locations are populated with sentinel values in the portion of the block being encoded. Similarly, if the portion being encoded is [B&&&], the first test values [AAAA] could be modified to second test values of [BBBB] and still be encoded in a single iteration using a test result bit of 0, an improved bit of 1, and a test result bit of 1, or 011.

Example Floating-Point Values

The above-introduced concepts can be readily employed for encoding of discrete values such as binary data, alphabetical data (e.g., character bytes), signed or unsigned integers, etc. For continuous values such as floating-point data, the encoding can determine that a given input value matches a test value when the difference falls within a specified error tolerance, as described more below.

Figure 6B:
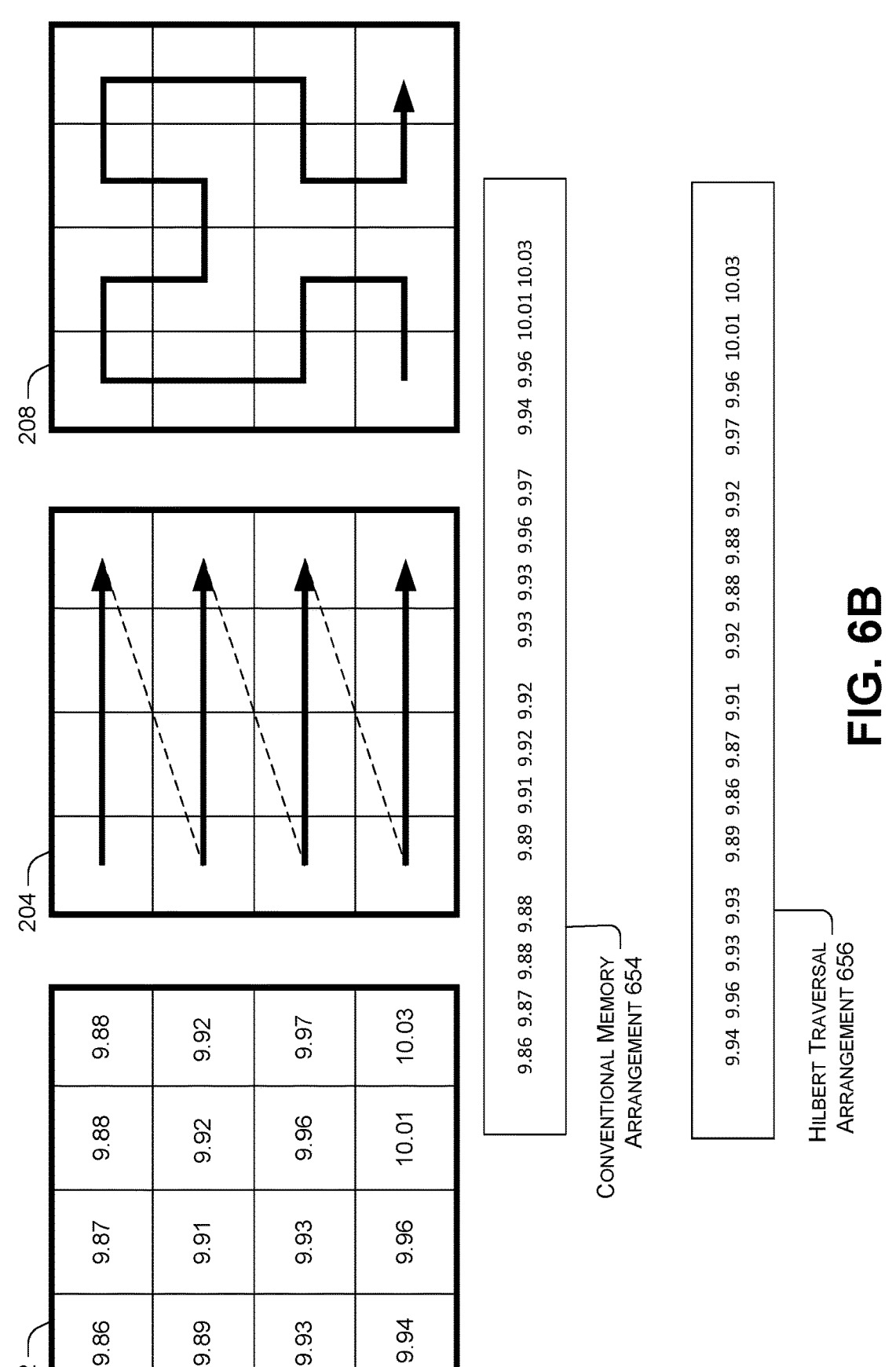
FIG. 6B illustrates spatial coherence of floating-point data, consistent with some implementations of the present concepts.

FIG. 6B illustrates a block of input data 652 with floating-point values. Generally speaking, the values are smaller at the top-left corner of the block and increase when moving down or to the right. When serialized according to scanning pattern 204, the resulting serialization is [9.86 9.87 9.88 9.88 9.89 9.91 9.92 9.92 9.93 9.93 9.96 9.97 9.94 9.96 10.01 10.03] as shown by conventional memory arrangement 654. When serialized according to scanning pattern 208, the resulting serialization is [9.94 9.96 9.93 9.93 9.89 9.86 9.87 9.91 9.92 9.88 9.88 9.92 9.97 9.96 10.01 10.03], as shown by Hilbert traversal arrangement 656.

Assume an example where the encoder uses an array of 16 first test values of 10.0 and an error tolerance of 0.05. Thus, any input value between 9.95 and 10.05 can be encoded identically, e.g., using a test result bit of 1 which can be decoded to a value of 10.0. For the conventional memory arrangement, the last four values of [9.94 9.96 10.01 10.03] include a value of 9.94. Because 9.94 is outside the error tolerance, these last values will be split during encoding and the test values of 10.0 will be modified to be within the error tolerance before encoding can complete. In contrast, the last four values of the Hilbert traversal, [9.97 9.96 10.01 10.03], are all within the error tolerance for this specific portion of the input data. As a consequence, no split is involved in encoding these four values. Thus, fewer encoding iterations are involved for encoding the floating-point values of the block when a Hilbert traversal is employed.

Floating-point input values that are not within the error tolerance during a given encoding iteration can be modified using floating-point operations. For instance, a floating-point addition operation or a floating-point subtraction operation can be performed on each particular floating-point input value. If the operation improves the match for a given portion of the input data, an improved bit with a value of [1] can be written to output as well as an identifier of the specific floating-point operation that improved the match.

Specific Compression and Decompression Algorithms

The encoding and decoding examples described above can be realized by various alternative algorithms. The following provides an example of specific encoding and decoding algorithms that can be employed. Note, however, that a skilled artisan will recognize various alternative techniques that can be employed to encode or decode data consistently with the concepts disclosed herein.

First, spatial data to be encoded can be arranged into a set of input blocks. Each block can include N values to code, where N can be a power of 2. The term "label" coding is used to refer to lossless compression of discrete values, e.g., N integers each in [0 . . . n−1]. For n=2, values can be coded as a bit vector. The term "delta" coding is used to refer to lossy compression of continuous values, e.g., N floating-point values with error tolerance $\tau$. For delta coding, the codec (encoder and/or decoder) can be prevented from decoding a result that differs by more than r compared with the source value encoded.

The term "sentinel" is used to refer to "free" or "don't care" values that represent locations in space that do not need to be properly encoded or decoded. For any slot in a block where a sentinel occurs, the encoder has the freedom to code the corresponding values however the codec wants, in order to improve or maximize compression. Any out-of-domain value can be used to represent a sentinel, such as −1 for label coding or a maximum finite value for floating-point coding. On decode, the decoder does not care what value is returned for the sentinel locations. For example, sentinels could indicate boundaries where the value is unlikely to be queried, such as walls in a sound wave simulation, solids in a fluid simulation, or 2D areas to be overlaid with text or graphics in a movie.

For continuous coding, blocks can represent a multi-dimensional (2D, 3D, etc.) subdomain of a data field. For example, blocks in a coded movie are 3D, representing a discretized 2D image rectangle over discretized time. Likewise, sound parameter fields can be represented as continuous functions of discretized 3D space. To code these, blocks of data can be serialized in 1D representations, and then resulting 1D serialization can be encoded. As described above, some implementations can arrange data in memory according to a space-filing curve such as a Hilbert traversal, which can take advantage of spatial coherence to improve compression over naive serialization techniques.

The disclosed implementations can operate by transforming some initial guess N-vector (e.g. the zero vector) of first test values into the serialized source block data by recursively splitting the block into halves, testing to see whether the currently decoded halves match the source test values, and if not applying some modification on each half of the test values to improve the match. This transformation can be recorded by the encoder and then applied by the decoder to the same initial test values to recover the block data. The rectification is partial in the sense that it improves but is not guaranteed to fully recover the block until the recursion bottoms out. The earlier in the recursion a match is obtained, the more effective is the compression.

Consider the encoder first. On entry, the variable label_decode stores an initial guess at the labeling (containing N first test values) which will also be known and input to the decoder. On exit, the variable label_decode stores the decoded result (as would also be returned by decoder) which will match all values in label_encode except for the values marked as sentinels. The algorithm may be realized via two co-routines:

```
encode_test(N, label_encode, label_decode)
    finished ← label_decode matches label_encode (not including free
    values)
    write finished bit to output
    if (¬ finished)
        encode_rectify(N, label_encode, label_decode)
encode_rectify(N, label_encode, label_decode)
    label_delta ← discrete delta to add to all N labels that improves match
    improved ← labeling could be improved by above (label_delta ≠ 0)
    write improved bit to output
    finished ← false
    if (improved)
        write label_delta to output
        // compute rectification on label_decode
        for i in [0..N−1] label_decode[i] = (label_decode[i] + label_delta)
        mod n
        if (N > 1)   // for N = 1 should be finished
            finished ← label_decode matches label_encode
            write finished bit
    if (¬ finished)
        // recurse to co-routine on both serialized halves
        N₂ ← N / 2
        encode_test(N₂, label_encode, label_decode)   // 1st half
        encode_test(N₂, label_encode+N₂, label_decode+N₂) // 2ⁿᵈ half
```

The label_delta for rectification can be computed via brute force search for a value which most reduces error. For instance, error can be defined as the number of non-free labels that do not match. Note that for the special case of binary data (n=2), if rectification is needed label_delta must be 1, and rectification amounts to flipping all the Boolean labels. Thus, no actual data need be written to represent label_delta, only the improved bit itself. For n=3, label delta $\in \{1,2\}$ and thus a single bit suffices to record its state.

The decoder can follow the same structure, reading instead of writing the finished and improved bits and label_delta value, and working on a single input/output argument (label_decode) rather than a label_encode/label_decode pair, since the source data represented by label_encode is to be recovered rather than input in this codec phase:

```
decode_test(N, label_decode)
    read finished bit from input
    if (¬ finished)
        decode_rectify(N, label_decode)
decode_rectify(N, label_decode)
    read improved bit from input
    finished ← false
    if (improved)
        read label_delta from input (or label_delta ← 1 for n = 2)
        // compute rectification in-place on label_decode
        for i in [0..N−1] label_decode[i] = (label_decode[i] + label_delta)
        mod n
        if (N > 1)
            read finished bit
    if (¬ finished)
        // recurse to co-routine on both halves
        N₂ ← N / 2
        decode_test(N₂, label_decode) // first half
        decode_test(N₂, label_decode+N₂)   // second half
```

The above-described routines can be employed for lossless label encoding/decoding of discrete values. For delta continuous encoding, the rectify operation can be modified to add a signed delta to the encoded output. The signed delta can be a small multiple (up to some specified limit specified as a configuration parameter) of the error tolerance $\tau$. Unlike the label codec, encoding of continuous values can employ a failure mode because a limited number of delta additions may be insufficient to reduce the error below tolerance even after the recursion bottoms out. The delta for rectification is again computed by brute force searching to most reduce error. For delta continuous encoding, error can be defined as the sum of tolerance quanta differences over all non-free values between the current encode and decode blocks.

Note that modifications to the routines described above can also be employed. For instance, some implementations can modify which co-routine is invoked at the outermost (full N) recursion level, whether to specially handle the terminal cases (N=1,2) especially for small n, whether to test before rectifying in encode_rectify, or to split in encode_test, etc.

TECHNICAL EFFECT

The disclosed implementations can offer particularly effective compression for spatial data that exhibits spatial coherence. Recall from above that, generally speaking, when fewer encoding iterations are employed to encode a given block of data or portion thereof, fewer resulting bits can be used to represent the block or portion of data. Thus, any block of data with characteristics that facilitate early termination of encoding tends to compress effectively using the techniques described herein.

When spatial data exhibits spatial coherence, similar values tend to be near one another in space. By using a space-filling curve such as a Hilbert traversal to serialize spatial data, the data can be arranged in memory so that values near one another in space are near one another in memory. Thus, similar values tend to be near one another in memory. As a consequence, values near one another in memory tend to either result in a positive match to test values in any given iteration, or tend to improve together when the same modification operations are performed to each value in a given portion.

In further cases, additional compression can be achieved by using prior knowledge about the distribution of spatial data to select initial test values and/or modifications that are likely to reduce the number of encoding iterations involved. For instance, consider a scenario with binary data where prior knowledge indicates that there tend to be more [1] bits than [0] bits in the data. In this case, initial test values of all [1] bits can be employed instead of all [0] bits, since it is more likely at any given encoding iteration that a string of [1] bits will match any portion of a given block.

Consider a floating-point examples next. Assume prior knowledge that blocks of floating-point data range from −10.0 to +10.0 and are likely to be uniformly distributed in space. In this case, initial test values of 0.0 might be suitable. However, if it is known in advance that most of the values will be negative and have a mean of −5.0, using first test values of −5.0 can result in more effective compression. This is for two reasons—first, the initial comparisons are more likely to result in a match between the input values and the test values. Second, modifications to the first test values, e.g., by adding or subtracting 0.5 to each test value, may be more likely to result in a match because the initial test values are likely closer to the input values than if naive initial test values (e.g., 0.0) were used instead.

In further implementations, prior knowledge may indicate that spatial coherence may exist across blocks of data. In this case, blocks may be encoded and decoded in a specific order, using the encodings of previously-encoded blocks to set the initial test values for the next block. The decoder can be configured to decode the blocks in the specified order.

The disclosed implementations can be employed for compression and decompression of many different types of multi-dimensional data. One example involves sound parameter fields that can be compressed using the disclosed implementations. For instance, initial loudness parameters can be computed for each voxel in a scene, where the loudness parameter represent the loudness of initial sound traveling from a given source location to a given listener location in the scene. Each 4×4×4 block of initial loudness parameters can be compressed as described herein, e.g., 64 initial loudness parameters per block. Walls in a virtual scene are one example of an appropriate location of a "don't-care" sentinel, assuming that audio will not be rendered for listener locations or sound sources inside of the walls. Note, however, that any multi-dimensional data can be compressed as disclosed herein, e.g., bitmaps of image data, video data, audio data, radar in-phase and quadrature data, data for virtual or augmented reality scenes, etc.

Example Compression Method

Figure 7:
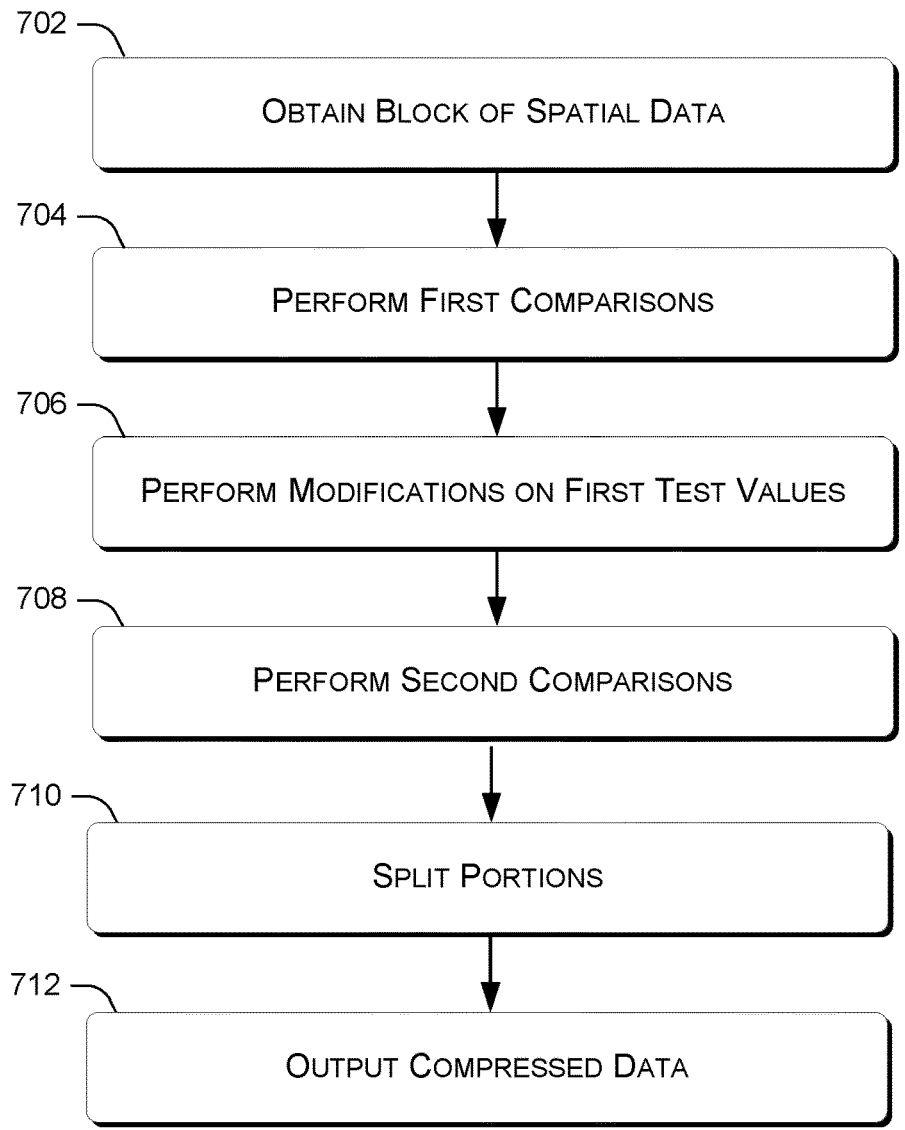
FIG. 7 illustrates an example method or technique for data compression, consistent with some implementations of the present concepts.

FIG. 7 illustrates an example method 700, consistent with the present concepts. As discussed more below, method 700 can be implemented on many different types of devices, e.g., by one or more cloud servers, by a client device such as a laptop, tablet, or smartphone, or by combinations of one or more servers, client devices, etc.

Method 700 begins at block 702, where a block of spatial data is obtained. For instance, the block can include data arranged in two or more dimensions.

Method 700 continues at block 704, where first comparisons of portions of the block to one or more first test values are performed. In some implementations, first comparisons can be implemented as provided above via the if (¬ finished) statement of the encode_test routine.

Method 700 continues at block 706, where one or more modifications are performed to the first test values when the first comparisons do not result in a match to obtain one or more second test values. In some implementations, the modifications can be implemented using the label_delta value of the encode_rectify routine.

Method 700 continues at block 708, where second comparisons of the portions of the block to the one or more second test values are performed. In some implementations, second comparisons can be implemented as provided above via the if (¬ finished) statement of the encode_rectify routine.

Method 700 continues at block 710, where the portions are split into further portions when the portions do not match the one or more first test values at block 704 and the portions do not match the one or more second test values at block 708. One or more further compression iterations can be performed on any such further portion by applying blocks 704, 706, 708, and/or 710 to the further portions. In some implementations, splitting can be performed in memory and implemented as provided above via the $N_2 \leftarrow N/2$ statement of the encode_rectify routine.

Method 700 continues at block 712, where compressed data is output. The compressed data can include first encoded values indicating whether matches were obtained for the first comparisons or the second comparisons for particular portions of the block of data and second encoded values reflecting results of the one or more modifications. In some implementations, the first encoded values can include test result bits, such as the finished bit provided above in the encode_test and encode_rectify routines. In some implementations, the second encoded values can include improved bits such as provided above in the encode_rectify routine.

The encoded representation can also include third encoded values identifying a specific modification operation performed during block 706. The specific modification operation can be selected from a plurality of modification operations based on respective errors resulting from each modification operation, e.g., the modification operation that results in the smallest error as described above.

Example Decompression Method

Figure 8:
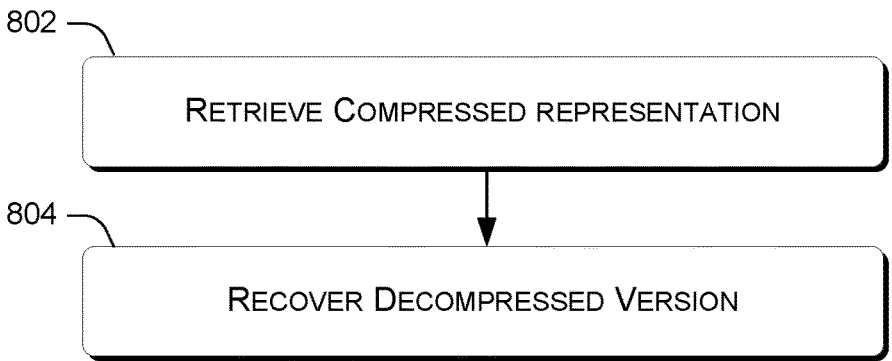
FIG. 8 illustrates an example method or technique for data decompression, consistent with some implementations of the present concepts.

FIG. 8 illustrates an example method 800, consistent with the present concepts. As discussed more below, method 800 can be implemented on many different types of devices, e.g., by one or more cloud servers, by a client device such as a laptop, tablet, or smartphone, or by combinations of one or more servers, client devices, etc.

Method 800 begins at block 802, where a compressed representation of a block of data is retrieved. The compressed representation can include first encoded values indicating whether portions of the block match test values. The compressed representation can also include second encoded values reflecting results of one or more modifications performed on the test values. In some implementations, the first encoded values can include test result bits, such as the finished bit provided above in the decode_test and decode_rectify routines. In some implementations, the second encoded values can include improved bits such as provided above in the decode_rectify routine. The compressed representation can also include third encoded values identifying a specific modification operation that was performed on test values when compressing the block of data.

Method 800 continues at block 804, where a decompressed version of the block of data is recovered. The decompressed version of the block can be recovered by selectively manipulating individual variables of the decompressed version according to the first encoded values and the second encoded values. In some cases, a particular variable or variables can be manipulated by performing a specific modification operation identified by a third encoded value in the compressed representation. The decompressed version can then be arranged in a multi-dimensional space according to a space-filling curve to reconstruct the original spatial data.

Example System

Figure 9:
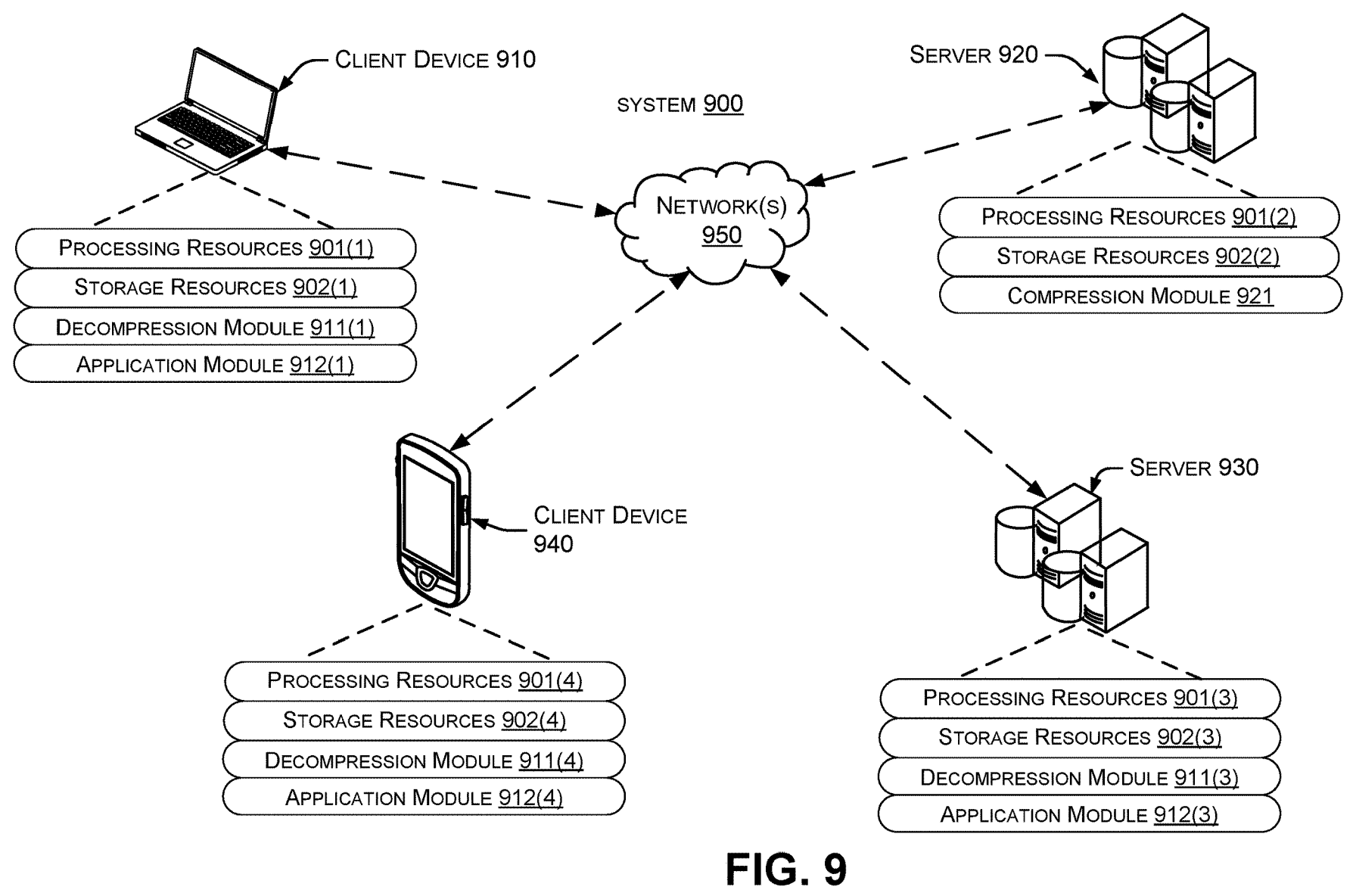

The present implementations can be performed in various scenarios on various devices. FIG. 9 shows an example system 900 in which the present implementations can be employed, as discussed more below.

As shown in FIG. 9, system 900 includes a client device 910, a server 920, a server 930, and a client device 940, connected by one or more network(s) 950. Note that the client devices can be embodied both as mobile devices such as smart phones or tablets, as well as stationary devices such as desktops, server devices, etc. Likewise, the servers can be implemented using various types of computing devices. In some cases, any of the devices shown in FIG. 9, but particularly the servers, can be implemented in data centers, server farms, etc.

Certain components of the devices shown in FIG. 9 may be referred to herein by parenthetical reference numbers. For the purposes of the following description, the parenthetical (1) indicates an occurrence of a given component on client device 910, (2) indicates an occurrence of a given component on server 920, (3) indicates an occurrence on server 930, and (4) indicates an occurrence on client device 940. Unless identifying a specific instance of a given component, this document will refer generally to the components without the parenthetical.

Generally, the devices 910, 920, 930, and/or 940 may have respective processing resources 901 and storage resources 902, which are discussed in more detail below. The devices may also have various modules that function using the processing and storage resources to perform the techniques discussed herein. The storage resources can include both persistent storage resources, such as magnetic or solid-state drives, and volatile storage, such as one or more random-access memory devices. In some cases, the modules are provided as executable instructions that are stored on persistent storage devices, loaded into the random-access memory devices, and read from the random-access memory by the processing resources for execution.

Server 920 can have a compression module 921 that compresses spatial data as described above with respect to method 700. Client device 910, server 930, and client device 940 can have instances of a decompression module 911 that decompresses data as described above with respect to method 800. Client device 910, server 930, and client device 940 can also have instances of an application module 912 that controls an output device according to the decompressed data. For instance, the application module can perform rendering of sound over a speaker based on acoustic perceptual parameters that have been decompressed, can control a display to perform fluid simulations based on decompressed simulation parameters, can render graphics in two or three dimensions based on decompressed graphics parameters, etc.

Device Implementations

As noted above with respect to FIG. 9, system 900 includes several devices, including a client device 910, a server 920, a server 990, and a client device 940. As also noted, not all device implementations can be illustrated, and other device implementations should be apparent to the skilled artisan from the description above and below.

The term "device", "computer," "computing device," "client device," and or "server device" as used herein can mean any type of device that has some amount of hardware processing capability and/or hardware storage/memory capability. Processing capability can be provided by one or more hardware processors (e.g., hardware processing units/cores) that can execute computer-readable instructions to provide functionality. Computer-readable instructions and/or data can be stored on storage, such as storage/memory and or the datastore. The term "system" as used herein can refer to a single device, multiple devices, etc.

Storage resources can be internal or external to the respective devices with which they are associated. The storage resources can include any one or more of volatile or non-volatile memory, hard drives, flash storage devices, and/or optical storage devices (e.g., CDs, DVDs, etc.), among others. As used herein, the term "computer-readable media" can include signals. In contrast, the term "computer-readable storage media" excludes signals. Computer-readable storage media includes "computer-readable storage devices." Examples of computer-readable storage devices include volatile storage media, such as RAM, and non-volatile storage media, such as hard drives, optical discs, and flash memory, among others.

In some cases, the devices are configured with a general purpose hardware processor and storage resources. In other cases, a device can include a system on a chip (SOC) type design. In SOC design implementations, functionality provided by the device can be integrated on a single SOC or multiple coupled SOCs. One or more associated processors can be configured to coordinate with shared resources, such as memory, storage, etc., and/or one or more dedicated resources, such as hardware blocks configured to perform certain specific functionality. Thus, the term "processor," "hardware processor" or "hardware processing unit" as used herein can also refer to central processing units (CPUs), graphical processing units (GPUs), controllers, microcontrollers, processor cores, or other types of processing devices suitable for implementation both in conventional computing architectures as well as SOC designs.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

In some configurations, any of the modules/code discussed herein can be implemented in software, hardware, and/or firmware. In any case, the modules/code can be provided during manufacture of the device or by an intermediary that prepares the device for sale to the end user. In other instances, the end user may install these modules/code later, such as by downloading executable code and installing the executable code on the corresponding device.

Also note that devices generally can have input and/or output functionality. For example, computing devices can have various input mechanisms such as keyboards, mice, touchpads, voice recognition, gesture recognition (e.g., using depth cameras such as stereoscopic or time-of-flight camera systems, infrared camera systems, RGB camera systems or using accelerometers/gyroscopes, facial recognition, etc.). Devices can also have various output mechanisms such as printers, monitors, etc.

Also note that the devices described herein can function in a stand-alone or cooperative manner to implement the described techniques. For example, the methods and functionality described herein can be performed on a single computing device and/or distributed across multiple computing devices that communicate over network(s) 950. Without limitation, network(s) 950 can include one or more local area networks (LANs), wide area networks (WANs), the Internet, and the like.

Various examples are described above. Additional examples are described below. One example includes a system comprising a processor and a computer-readable storage medium storing computer-readable instructions which, when executed by the processor, cause the system to obtain a block of spatial data having input values arranged in two or more dimensions and perform one or more compression iterations comprising performing first comparisons of portions of the block of spatial data to one or more first test values, when the first comparisons do not result in a match of the portions of the block to the one or more first test values, performing one or more modifications on the one or more first test values to obtain one or more second test values, performing second comparisons of the portions of the block of data to the one or more second test values, and when the second comparisons do not result in a match of the portions of the block to the one or more second test values, splitting the portions into further portions and performing another compression iteration on the further portions and output compressed data including first encoded values indicating whether matches were obtained for the first comparisons or the second comparisons for particular portions of the block of data and second encoded values reflecting results of the one or more modifications.

Another example can include any of the above and/or below examples where the computer-readable instructions, when executed by the processor, cause the system to arrange the input values of the block of spatial data in memory according to a space-filling curve and wherein the splitting is performed in memory after the input values are arranged in the memory.

Another example can include any of the above and/or below examples where the space-filling curve comprises a Hilbert curve.

Another example can include any of the above and/or below examples where the first encoded values comprise test result bits and the second encoded values comprise improved bits, the improved bits reflecting whether the one or more modifications cause the one or more second test values to be relatively more similar to the particular portions than the one or more first test values.

Another example can include any of the above and/or below examples where the compressed data includes one or more third encoded values identifying a specific modification operation that was performed on the one or more first test values to obtain the one or more second test values.

Another example can include any of the above and/or below examples where the computer-readable instructions, when executed by the processor, cause the system to select the specific modification operation from a plurality of modification operations based at least on respective errors obtained after each of the plurality of modification operations.

Another example can include any of the above and/or below examples where the errors are determined based on a number of the one or more second test values that differ from the particular portions.

Another example can include any of the above and/or below examples where the computer-readable instructions, when executed by the processor, cause the system to identify a sentinel value in a specific portion of the block of data and encode the specific portion of the block of data while ignoring an error at a location of the sentinel value.

Another example can include any of the above and/or below examples where the input values comprise a plurality of floating-point input values and the one or more modifications comprise performing a floating-point addition or a floating-point subtraction operation on a particular floating-point input value.

Another example can include any of the above and/or below examples where the computer-readable instructions, when executed by the processor, cause the system to in an instance when all floating-point input values of a specific portion of the block are within a specified error tolerance of the one or more first test values or the one or more second test values, determine that a match is obtained for the specific portion.

Another example includes a method performed on a computing device, the method comprising retrieving a compressed representation of a block of data including first encoded values indicating whether portions of the block match test values and second encoded values reflecting results of one or more modifications performed on the test values and recovering a decompressed version of the block by selectively manipulating one or more variables of the decompressed version according to the first encoded values and the second encoded values.

Another example can include any of the above and/or below examples where the method further comprises determining whether a particular portion of the block has been recovered based at least on the first encoded values.

Another example can include any of the above and/or below examples where the first encoded values comprise test result bits.

Another example can include any of the above and/or below examples where the method further comprises Another example can include any of the above and/or below examples where determining whether to perform the one or more modifications to individual variables of the decompressed version based at least on the second encoded values.

Another example can include any of the above and/or below examples where the second encoded values comprise improved bits.

Another example can include any of the above and/or below examples where the compressed representation identifies a specific modification to perform on a particular variable to recover a particular portion of the block.

Another example can include any of the above and/or below examples where the specific modification involves performing a floating-point addition or a floating-point subtraction operation on the particular variable.

Another example can include any of the above and/or below examples where the method further comprises arranging the decompressed version in a multi-dimensional space according to a space-filling curve.

Another example includes a computer-readable storage medium storing executable instructions which, when executed by a processor, cause the processor to perform acts comprising retrieving a compressed representation of a block of data including first encoded values indicating whether portions of the block match test values and second encoded values reflecting results of one or more modifications performed on the test values, recovering a decompressed version of the block by selectively manipulating one or more variables of the decompressed version according to the first encoded values and the second encoded values, and controlling an output device according to the decompressed version of the block.

CONCLUSION

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and other features and acts that would be recognized by one skilled in the art are intended to be within the scope of the claims.

The invention claimed is:
1. A system comprising:
a processor; and
a computer-readable storage medium storing computer-readable instructions which, when executed by the processor, cause the system to:
obtain a block of spatial data having input values arranged in two or more dimensions;

perform one or more compression iterations comprising:
performing first comparisons of portions of the block of spatial data to one or more first test values;
when the first comparisons do not result in a match of the portions of the block of spatial data to the one or more first test values, performing one or more bit flipping operations on the one or more first test values to obtain one or more second test values;
performing second comparisons of the portions of the block of spatial data to the one or more second test values; and
when the second comparisons do not result in a match of the portions of the block of spatial data to the one or more second test values, splitting the portions into further portions and performing another compression iteration on the further portions; and
output compressed data, the compressed data including first encoded values indicating whether matches were obtained for the first comparisons or the second comparisons for particular portions of the block of spatial data, and second encoded values reflecting results of the one or more bit flipping operations.

2. The system of claim 1, wherein the computer-readable instructions, when executed by the processor, cause the system to:
arrange the input values of the block of spatial data in memory according to a space-filling curve,
wherein the splitting is performed in memory after the input values are arranged in the memory.

3. The system of claim 2, wherein the space-filling curve comprises a Hilbert curve.

4. The system of claim 1, wherein the first encoded values comprise test result bits and the second encoded values comprise improved bits, the improved bits reflecting whether the one or more bit flipping operations cause the one or more second test values to be relatively more similar to the particular portions than the one or more first test values.

5. The system of claim 4, wherein the compressed data includes one or more third encoded values identifying a specific bit flipping operation that was performed on the one or more first test values to obtain the one or more second test values.

6. The system of claim 5, wherein the computer-readable instructions, when executed by the processor, cause the system to:
select the specific bit flipping operation from a plurality of bit flipping operations based at least on respective errors obtained after each of the plurality of bit flipping operations.

7. The system of claim 6, wherein the errors are determined based on a number of the one or more second test values that differ from the particular portions.

8. The system of claim 1, wherein the computer-readable instructions, when executed by the processor, cause the system to:
identify a sentinel value in a specific portion of the block of spatial data; and
encode the specific portion of the block of spatial data while ignoring an error at a location of the sentinel value.

9. The system of claim 1, wherein the second encoded values indicate whether the one or more bit flipping operations resulted in the one or more second test values having a lower Hamming distance from the particular portions of the block of spatial data than the one or more first test values.

10. The system of claim 9, wherein the second encoded values comprise improved bits having the same value for individual second test values that completely match corresponding portions of the block of spatial data and other second test values that partially match other portions of the block of spatial data.

11. A method performed on a computing device, the method comprising:

retrieving a compressed representation of a block of data, the compressed representation including first encoded values indicating whether portions of the block of data match test values and second encoded values reflecting results of one or more bit flipping operations performed on the test values; and recovering a decompressed version of the block of data by selectively manipulating one or more variables of the decompressed version according to the first encoded values and the second encoded values.

12. The method of claim 11, further comprising:

determining whether a particular portion of the block of data has been recovered based at least on the first encoded values.

13. The method of claim 12, the first encoded values comprising test result bits.

14. The method of claim 13, further comprising:

determining whether to perform the one or more bit flipping operations to individual variables of the decompressed version based at least on the second encoded values.

15. The method of claim 14, wherein the second encoded values comprise improved bits.

16. The method of claim 15, wherein the improved bits indicate whether the one or more bit flipping operations resulted in lower Hamming distances between the portions of the block of data and the test values.

17. The method of claim 11, wherein the compressed representation identifies a specific modification to perform on a particular variable to recover a particular portion of the block of data.

18. The method of claim 11, further comprising:

arranging the decompressed version in a multi-dimensional space according to a space-filling curve.

19. A computer-readable storage medium storing executable instructions which, when executed by a processor, cause the processor to perform acts comprising:

retrieving a compressed representation of a block of data, the compressed representation including first encoded values indicating whether portions of the block of data match test values and second encoded values reflecting results of one or more bit flipping operations performed on the test values;

recovering a decompressed version of the block of data by selectively manipulating one or more variables of the decompressed version according to the first encoded values and the second encoded values; and controlling an output device according to the decompressed version of the block of data.

20. The computer-readable storage medium of claim 19, the output device comprises a speaker, wherein controlling the output device comprises rendering of sound based at least on acoustic perceptual parameters recovered in the decompressed version of the block of data.

* * * * *